United States Patent
Porzio et al.

(10) Patent No.: US 12,019,884 B2
(45) Date of Patent: Jun. 25, 2024

(54) IDENTIFICATION AND STORAGE OF BOOT INFORMATION AT A MEMORY SYSTEM

(71) Applicant: Micron Technology, Inc., Boise, ID (US)

(72) Inventors: Luca Porzio, Casalnuovo (IT); Roberto Izzi, Caserta (IT); Christian M. Gyllenskog, Meridian, ID (US); Giuseppe Cariello, Boise, ID (US); Jonathan S. Parry, Boise, ID (US); Reshmi Basu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 135 days.

(21) Appl. No.: 17/651,215

(22) Filed: Feb. 15, 2022

(65) Prior Publication Data

US 2023/0259291 A1    Aug. 17, 2023

(51) Int. Cl.
*G06F 3/06* (2006.01)
*G06F 12/02* (2006.01)

(52) U.S. Cl.
CPC .......... *G06F 3/0632* (2013.01); *G06F 3/0604* (2013.01); *G06F 3/0659* (2013.01); *G06F 3/0679* (2013.01); *G06F 12/0238* (2013.01); *G06F 2212/7201* (2013.01)

(58) Field of Classification Search
CPC .... G06F 3/0632; G06F 3/0604; G06F 3/0659; G06F 3/0679; G06F 12/0238; G06F 2212/7201
See application file for complete search history.

(56) References Cited

U.S. PATENT DOCUMENTS

| | | | | |
|---|---|---|---|---|
| 9,804,785 | B2 * | 10/2017 | Cohen | G06F 3/0611 |
| 2009/0235036 | A1 * | 9/2009 | Ro | G06F 12/0223 |
| | | | | 711/170 |
| 2012/0260027 | A1 * | 10/2012 | Toelkes | G06F 9/4418 |
| | | | | 711/E12.008 |
| 2012/0265921 | A1 * | 10/2012 | Post | G06F 12/0638 |
| | | | | 711/E12.008 |
| 2014/0095856 | A1 * | 4/2014 | Tearse-Doyle | G06F 9/4401 |
| | | | | 713/2 |
| 2016/0085455 | A1 * | 3/2016 | Cohen | G06F 3/0611 |
| | | | | 711/103 |
| 2018/0173536 | A1 * | 6/2018 | Sela | G06F 9/441 |
| 2019/0026029 | A1 * | 1/2019 | Lee | G06F 3/0659 |
| 2019/0188076 | A1 * | 6/2019 | Chen | G06F 11/1048 |
| 2019/0188082 | A1 * | 6/2019 | Lee | G06F 11/1441 |

* cited by examiner

*Primary Examiner* — Ryan Bertram
(74) *Attorney, Agent, or Firm* — Holland & Hart LLP

(57) ABSTRACT

Methods, systems, and devices for identification and storage of boot information at a memory system are described to support transferring boot information to higher reliability memory storage. A memory system may identify boot information stored at a memory array based on a command received from a host system, which may identify the boot information for the memory system, or based on performing a boot procedure with the host system, in which the boot information may be requested from the memory system. After identifying the boot information stored at the memory array, the memory system may move or transfer the boot information from physical addresses associated with lower reliable memory storage to physical addresses associated with higher reliable memory storage.

25 Claims, 6 Drawing Sheets

IDENTIFICATION AND STORAGE OF BOOT INFORMATION AT A MEMORY SYSTEM

FIELD OF TECHNOLOGY

The following relates to one or more systems for memory, including identification and storage of boot information at a memory system.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
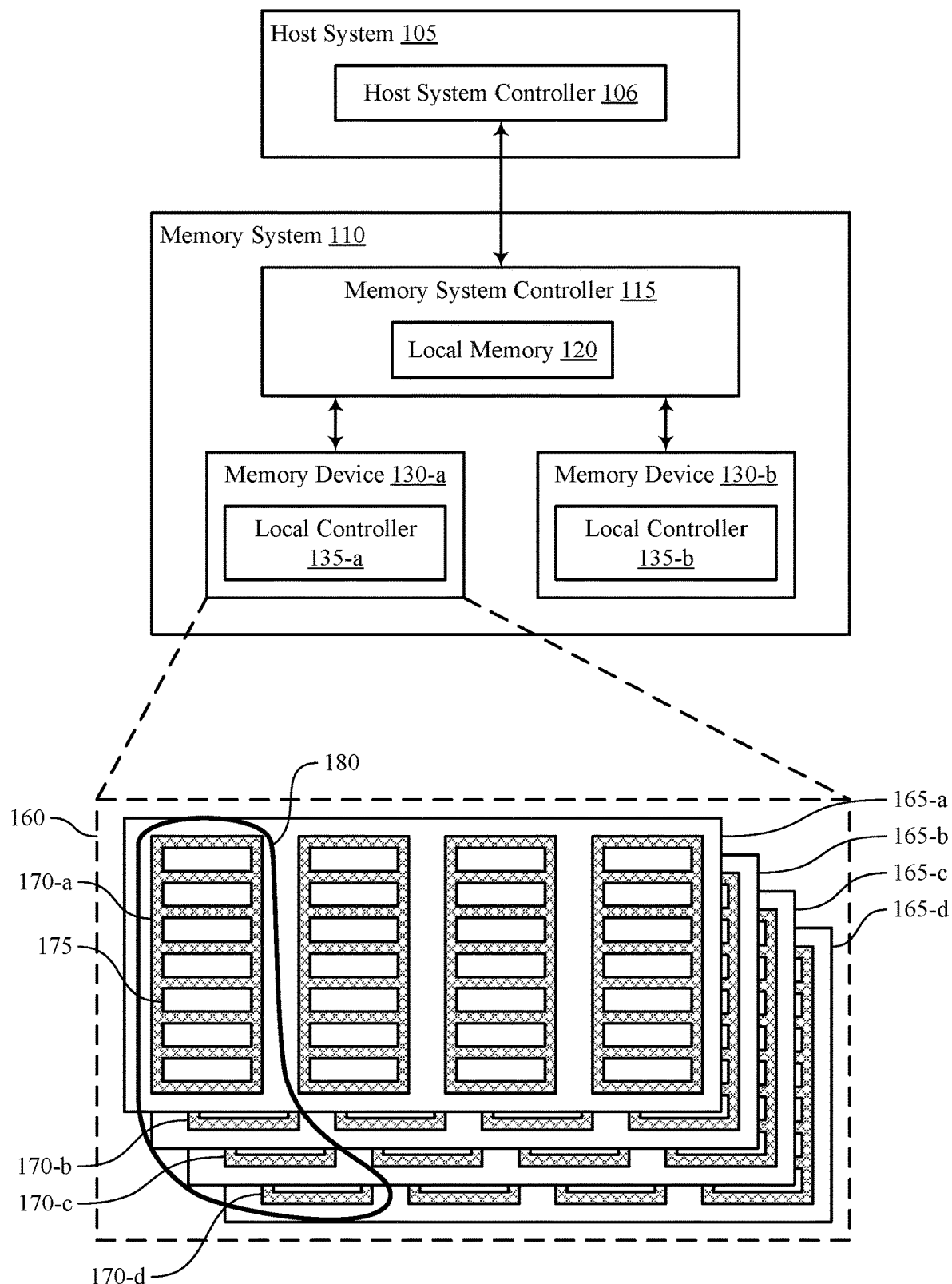
FIG. 1 illustrates an example of a system that supports identification and storage of boot information at a memory system in accordance with examples as disclosed herein.

Boot information, for example information used for initializing a host system, may be stored at a memory array of a memory system. In examples in which performing one or more initialization features or operations, the host system may issue a command (e.g., a read command, a boot read command) to the memory system to access the boot information and transmit the boot information to the host system. Performing a boot procedure may include issuing one or more such read commands (e.g., boot commands, boot read commands) to the memory system, where the read command(s) may each be associated with a respective portion (e.g., subset) of the boot information stored at the memory array. For example, each read command may indicate a respective set of logical addresses associated with the boot information, and may further indicate that these logical addresses are associated with boot information. In response to the read command(s), the memory system may identify respective physical addresses of the memory array associated with the indicated logical addresses, may access data associated with the physical addresses (e.g., access the boot information), and may transmit the data to the host system.

If the boot information, or a portion thereof, is stored in cells having multiple levels, in some cases a boot operation or procedure of the host system may experience increased latency, decreased predictability (e.g., for correctly and timely accessing the boot information), or a higher error rate (e.g., a higher bit error rate), among other issues. If the memory system is delayed in completing some boot operations, or if errors are introduced to the boot information, the boot procedure at the host system may be compromised and the host system may enter a state (e.g., an unreliable state) such as a boot loop state or a factory mode, which may reduce host system reliability and functionality, as well as increase host system latency.

The present disclosure provides techniques for identifying boot information stored at the memory array of the memory system and transferring the boot information to one or more locations of the memory array with a higher reliability. Based on or in response to transferring the boot information to the higher reliability locations of the memory array, the boot information may be accessed with reduced latency and reduced errors. In a first example, the memory system may identify the boot information stored at the memory array based on or in response to a command received from the host system, where the command may be specific to the host system (e.g., a custom command). For example, the command may identify data stored at the memory array as boot information, and may indicate a set of logical addresses associated with the boot information. In a second example, the memory system may identify the boot information stored at the memory array based on or in response to receiving one or more read commands as part of a boot procedure for the host system. For example, the memory system may automatically detect the boot procedure and associated boot information, based on or in response to receiving the one or more read commands. After identifying the boot information stored at the memory array, the memory system may move or transfer the boot information from physical addresses associated with the lower reliable memory storage to physical addresses associated with higher reliable memory storage.

In some cases, the memory system may apply one or more redundancy techniques after moving the boot information, which may further increase a reliability of the boot information stored at the memory array. For example, the memory system may write the boot information twice (e.g., in two different locations such as different sets of physical addresses of the memory array) or may generate an additional parity page (e.g., additional parity bits) after moving the boot information (e.g., in addition to generating initial parity bits for the boot information).

Figure 2:
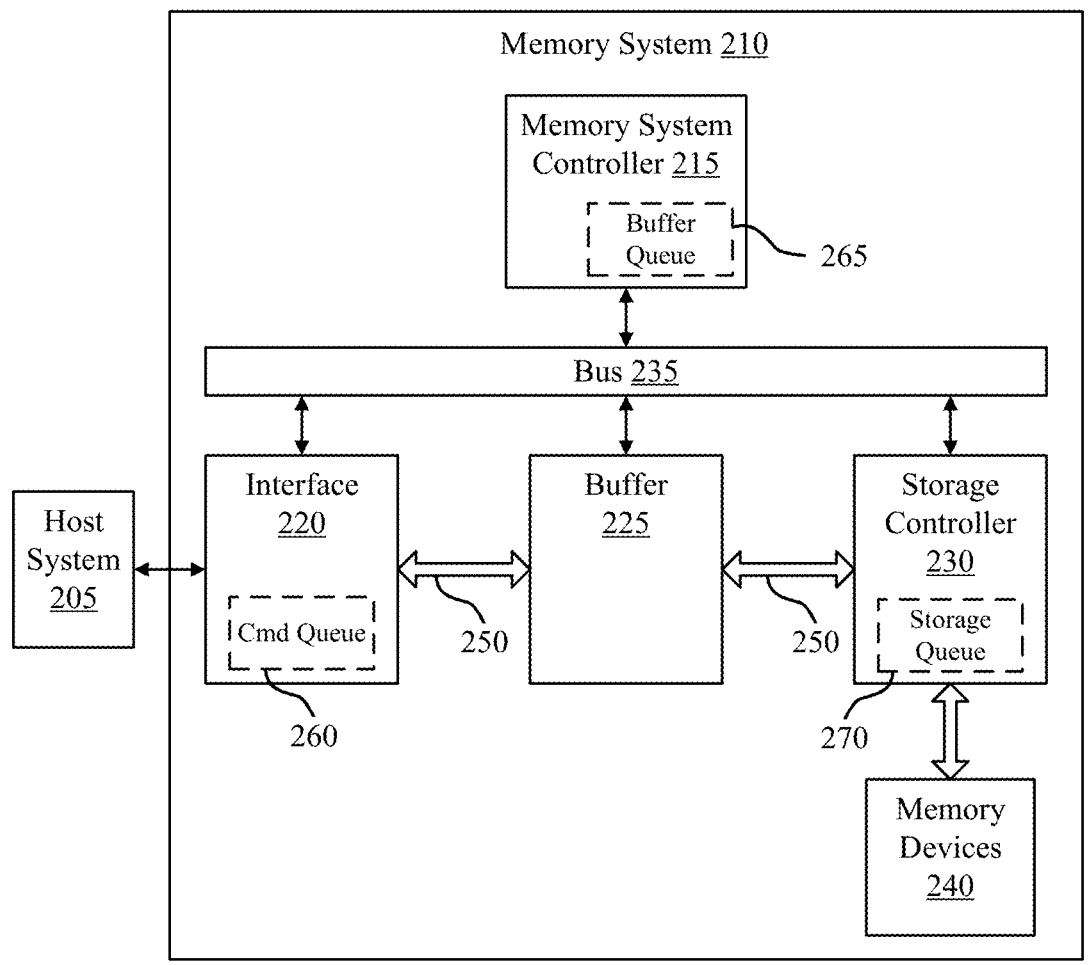
FIG. 2 illustrates an example of a system that supports identification and storage of boot information at a memory system in accordance with examples as disclosed herein.

Features of the disclosure are initially described in the context of systems, devices, and circuits with reference to FIGS. 1 and 2. Features of the disclosure are described in the context of a system architecture and a process flow with reference to FIGS. 3 and 4. These and other features of the disclosure are further illustrated by and described in the context of an apparatus diagram and flowchart that relate to identification and storage of boot information at a memory system with reference to FIGS. 5 and 6.

FIG. 1 illustrates an example of a system 100 that supports identification and storage of boot information at a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMN interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MHLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform a data management operation (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support identification and storage of boot information at a memory system. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

A memory system 110 may identify boot information stored at a memory array (e.g., one or more dies 160) of the memory system 110 and may transfer the boot information to one or more locations of the memory array with a higher reliability. For example, the memory system 110 may identify boot information stored at the memory array based on or in response to a command received from a host system 105, which may identify the boot information for the memory system 110, or based on or in response to performing a boot procedure with the host system 105, in which the boot information may be requested from the memory system 110. After identifying the boot information stored at the memory array, the memory system 110 may move or transfer the boot information from physical addresses associated with the lower reliable memory storage to physical addresses associated with higher reliable memory storage.

FIG. 2 illustrates an example of a system 200 that supports identification and storage of boot information at a memory system in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement various aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) after a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on or in response to the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

After the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, a time that the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

After the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

Figure 3:
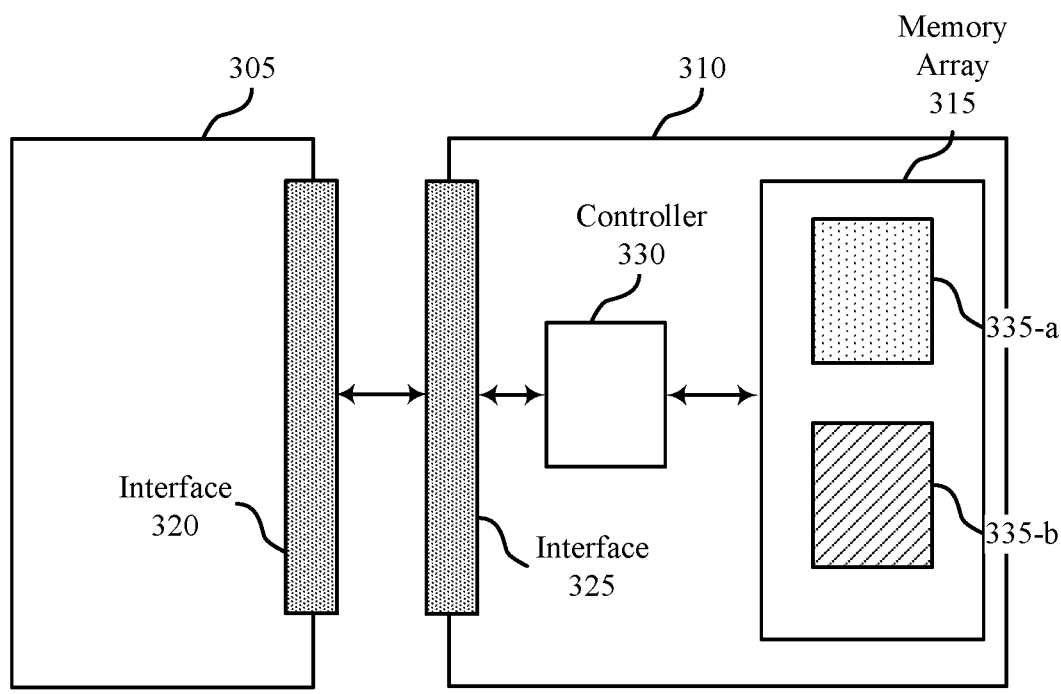
FIG. 3 illustrates an example of a system architecture that supports identification and storage of boot information at a memory system in accordance with examples as disclosed herein.

FIG. 3 illustrates an example of a system architecture 300 that supports identification and storage of boot information at a memory system in accordance with examples as disclosed herein. The system architecture 300 may include a host system 305 and a memory system 310, which may represent examples of a host system and a memory system described with reference to FIGS. 1 and 2. The memory system 310 and the host system 305 may be electrically and/or communicatively coupled, such that the memory system 310 and the host system 305 may communicate (e.g., respectively transmit and receive) one or more commands, data, or other information. For example, the memory system 310 may be coupled with the host system 305 via an interface 325 (e.g., one or more pins, balls, or pads) at the memory system 310 and an interface 320 (e.g., one or more pins, balls, or pads) at the host system 305.

The memory system 310 may include a memory array 315, which may represent an example of one or more NAND memory arrays as described with reference to FIGS. 1 and 2. The memory system 310 may also include a controller 330, which may be operable to receive commands and/or information from the host system 305 (e.g., via the interface 325), perform or initiate one or more operations at the memory system 310 (e.g., one or more access or other operations), or otherwise assist in or control management of the memory system 310. As such, the controller 330 may be coupled with the memory array 315 and the interface 325. In some cases, the memory array 315 may additionally or alternatively be coupled with the interface 325.

In some cases, the memory array 315 may include, or be divided into, one or more sections 335, where each section 335 may be associated with one or more corresponding groups of memory cells. For example, the memory array 315 may include a section 335-a and a section 335-b, where section 335-a may be associated with or include a first group of memory cells and section 335-b may be associated with or include a second group of memory cells. As such, section 335-a may include or be associated with a first set of multiple physical addresses of the memory array 315, and section 335-b may include or be associated with a second set of multiple physical addresses of the memory array 315.

It is to be understood that the sections 335 described herein may have any size (e.g., may include any quantity of memory cells) and a memory array 315 may include any quantity of sections 335. While two sections 335 are described herein, it is to be understood that the memory array 315 may include one or more additional sections 335 (e.g., in addition to the two sections 335), may include one section 335, or may include different sizes or configurations of sections 335. Additionally, each section 335 may include some cells which may not necessarily be adjacent to, or physically close to, other cells of the section 335.

In one example, section 335-a may include memory cells having multiple levels, such as MLCs, TLCs, and/or QLCs. The memory cells of section 335-a may all have multiple levels, or a portion of the memory cells of section 335-a may have multiple levels (e.g., a sub-section of section 335-a). Similarly, section 335-b may include memory cells having one level, such as SLCs, which may be associated with a higher reliability (e.g., for data storage, retention, and reading) than cells having multiple levels. For example, the SLCs may have a higher predictability for retaining and recalling correct data than cells having multiple levels, and/or may have a lower latency of operation (e.g., lower latency for storing and/or reading data) than cells having multiple levels. In some cases, section 335-b may represent a static SLC block, or a static, reserved SLC block.

In some cases, boot information, or information for initializing the host system 305, may be stored at the memory array 315. In such cases, during initializing (e.g., during performing one or more initialization features or operations), the host system 305 may issue a command (e.g., a read command, a boot read command) to the memory system 310 to access the boot information and transmit the boot information to the host system 305. During boot time (e.g., during performing the boot procedure, during initializing the host system 305), one or more boot operations may be associated with a time window or a timer for performing the respective boot operation. For example, performing the boot procedure at the host system 305 may include issuing a first read command (e.g., a first boot command, a first boot read command) to the memory system 310, where the first read command may be associated with a first portion (e.g., a first subset) of the boot information stored at the memory array 315. For example, the first read command may indicate a first set of logical addresses (e.g., LBAs) associated with the boot information (e.g., associated with the first subset of the boot information), and may further indicate that these logical addresses are associated with boot information.

In response to the first read command, the memory system 310 (e.g., the controller 330) may identify a first set of physical addresses of the memory array 315 (e.g., section 335-a, or a portion thereof) associated with the first set of logical addresses. Based on or in response to identifying the corresponding physical addresses (e.g., memory cells), the memory system 310 may read the first subset of boot information from the memory array 315 (e.g., from section 335-a of the memory array) and may transmit the first subset of boot information to the host system 305. The host system 305 may follow the first read command with one or more second read commands (e.g., boot commands, read boot commands), where each following command may be associated with a respective portion or subset of the boot information stored at the memory array. For example, each second read command may indicate a respective set of logical addresses (e.g., LBAs) associated with the boot information (e.g., associated with a respective subset of the boot information), and may indicate that these logical addresses are associated with boot information.

In response to each second read command, the memory system 310 (e.g., the controller 330) may, identify a respective set of physical addresses of the memory array 315 (e.g., section 335-a, or a portion thereof) associated with the indicated set of logical addresses. Based on or in response to identifying the corresponding physical addresses (e.g., memory cells), the memory system 310 may read the corresponding subset of boot information from the memory array 315 (e.g., from section 335-a of the memory array) and may transmit the subset of boot information to the host system 305. As such, during a boot procedure, the host system 305 may issue multiple read commands and the memory system 310 may read the associated boot information to the host system 305, where each command may indicate a respective set of logical addresses associated with a corresponding portion of the boot information (e.g., stored at corresponding physical addresses of the memory array 315, such as at section 335-a). In some cases, the read commands (e.g., and associated boot information and logical addresses) may be in order of importance (e.g., criticality) for the boot procedure. For example, the first read command may indicate a subset of the boot information that is most important (e.g., critical), a next read command may indicate a subset of the boot information that is the next most important, and so on.

If the boot information, or a portion thereof, is stored in cells having multiple levels (e.g., if the boot information is store at section 335-a of the memory array 315), in some cases, a boot operation of the host system 305 may experience problems such as increased latency, decreased predictability (e.g., for correctly and timely accessing the boot information), or a higher error rate (e.g., a higher bit error rate), among other examples. For example, one or more conditions, such as temperature, a read disturb, or an extreme environmental condition, may influence or change information stored at section 335-a (e.g., the cells with multiple levels) or may influence or change an amount of time for accessing the information stored at section 335-a (e.g., the cells with multiple levels). If the memory system 310 is delayed in completing some boot operations (e.g., from the timing of the one or more boot operations or commands), the boot procedure at the host system 305 may be compromised and the host system 305 may enter a state (e.g., an unreliable state) such as a boot loop state or a factory mode (e.g., which may be associated with technical assistance for operation).

The present disclosure provides techniques for identifying boot information stored at the memory array 315 of the memory system 310 (e.g., stored at section 335-a) and transferring the boot information to one or more locations of the memory array 315 with a higher reliability (e.g., section 335-b, physical addresses associated with section 335-b). Based on or in response to transferring the boot information to higher reliability memory (e.g., section 335-b, physical addresses associated with section 335-b), the boot information may be accessed with reduced latency and reduced errors, for example, in comparison to storing the boot information at less reliable memory (e.g., at section 335-a).

In a first example, the memory system 310 may identify the boot information stored at the memory array 315 (e.g., at section 335-a) based on or in response to a command received from the host system, where the command may be specific to the host system 305 (e.g., a custom command). For example, the command may identify data stored at the memory array 315 as boot information, and may indicate a set of logical addresses associated with the boot information. The command may identify that the logical addresses are associated with the boot information using a flag or other identifier (e.g., using a command identifier or OPCODE, using a flag or identifier within the command). In some cases, the command may be a read command, a write command, or other defined command that may be reused by the host system 305, and may be identified as associated with the boot information using the flag or other identifier. In some cases, the command may identify a quantity of boot information up to a threshold (e.g., maximum) quantity of boot information that may be transferred to the higher reliability memory (e.g., a size or quantity of storage associated with section 335-b or the memory array 315).

The threshold quantity of boot information may represent reserved memory (e.g., memory cells, a memory section), such as section 335-b (e.g., reserved memory with higher reliability), which may be dedicated for boot information. Such reserved memory (e.g., memory cells) may be reserved (e.g., taken out of) memory available for a user of the memory system 310. In one example, if the memory system 310 includes 32 gigabytes (GB) of memory and a virtual block of the memory system 310 includes 768 megabytes (MB) (e.g., as TLCs), one block of memory may be reserved for boot data (e.g., in SLCs). In such cases, the boot information may take up to 256 MB of memory storage in the block, for example, based on a ratio of TLCs to SLCs (e.g., based on a ratio of 3:1, which results in 256 MB of the 768 MB available for SLC storage). In this example, the memory system 310 may indicate (e.g., directly, via a register) that the threshold for boot information is 256 MB (e.g., that information above 256 MB of data read at a boot time may not be stored at the dedicated memory).

In a second example, the memory system 310 may identify the boot information stored at the memory array 315 (e.g., at section 335-a) based on or in response to receiving one or more read commands as part of a boot procedure for the host system 305. For example, the memory system 310 may automatically detect the boot procedure (e.g., a boot time) and associated boot information, based on or in response to receiving the one or more read commands. Upon receiving a first boot command, the memory system may enter a state for detecting or identifying the boot information, which may be referred to as a boot detection state, among other examples. In the boot detection state, the memory system 310 may track logical addresses indicated in the one or more boot read commands, up to a threshold (e.g., maximum) quantity of boot information that may be transferred to the higher reliability memory (e.g., a size or quantity of storage associated with section 335-b or the memory array 315).

After identifying the boot information stored at the memory array 315 (e.g., according to the first example or the second example), the memory system 310 may move or transfer the boot information from physical addresses associated with the less reliable memory storage (e.g., from section 335-a, from a first set of physical addresses) to physical addresses associated with the more reliable memory storage (e.g., to section 335-b, to a second set of physical addresses). For example, the memory system 310 may move or transfer the boot information during an idle time, such as during a data refresh procedure or a defragmentation procedure performed at memory array 315.

In some cases, the memory system 310 may apply one or more redundancy techniques as part of or after moving the boot information, which may further increase a reliability of the boot information stored at the memory array 315. For example, the memory system 310 may write the boot information twice (e.g., in two different locations such as two different sets of physical addresses of the memory array 315) or may generate an additional parity page (e.g., additional parity bits) after moving the boot information (e.g., in addition to generating initial parity bits for the boot information), or both (e.g., writing the boot information multiple times and generating one or more additional parity pages).

Figure 4:
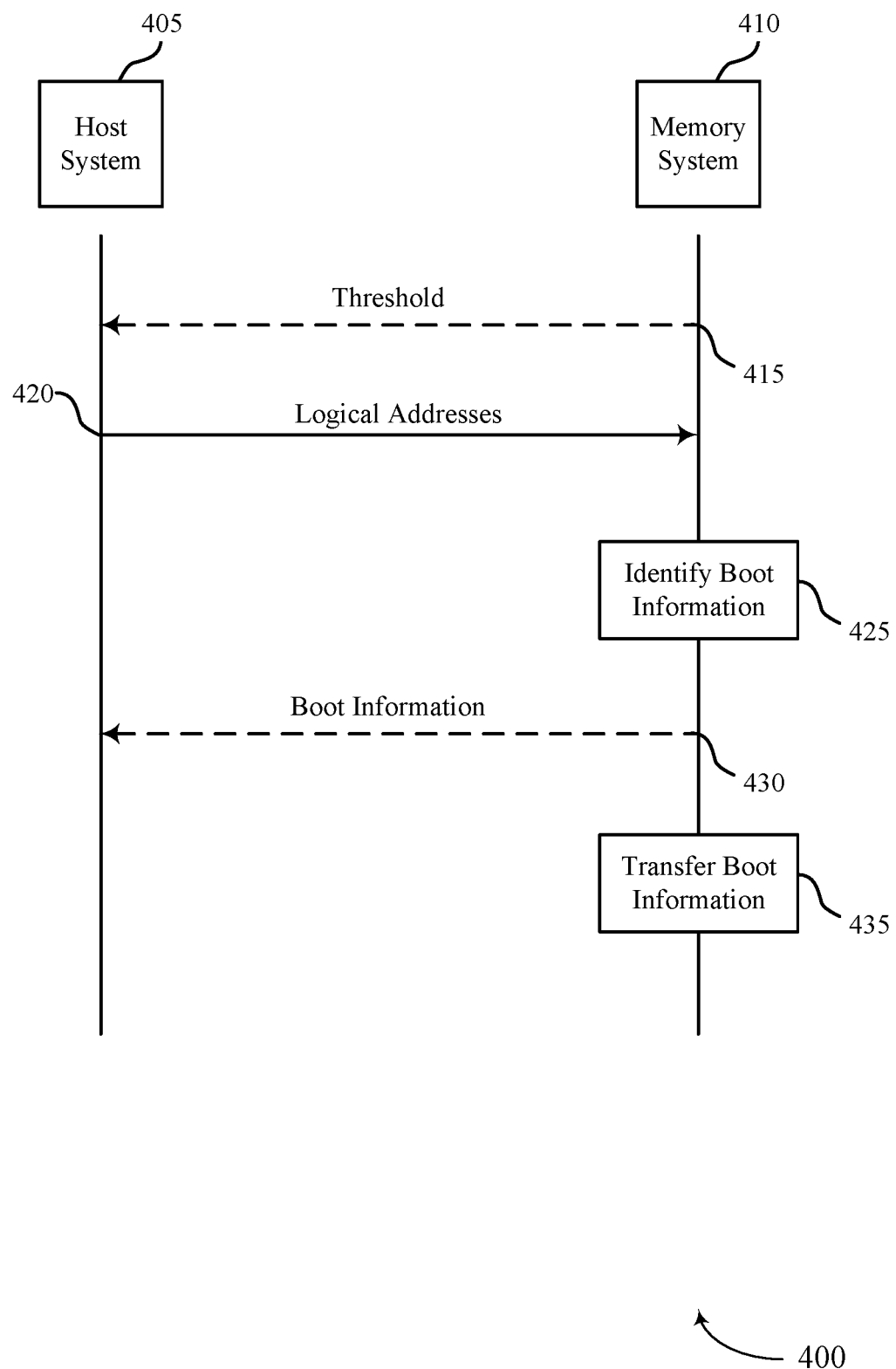
FIG. 4 illustrates an example of a process flow that supports identification and storage of boot information at a memory system in accordance with examples as disclosed herein.

FIG. 4 illustrates an example of a process flow 400 that supports identification and storage of boot information at a memory system in accordance with examples as disclosed herein. In some examples, process flow 400 may implement or be implemented by one or more aspects of systems 100 or 200, as well as system architecture 300. For example, process flow 400 may be implemented by a host system 405 and a memory system 410, which may be examples of a host system and a memory system described with reference to FIGS. 1-3.

In the following description of process flow 400, the operations may be performed in a different order than the order shown, or the operations performed by host system 405 and memory system 410 may be performed in different orders or at different times. For example, some operations may also be left out of process flow 400, or other operations may be added to process flow 400. Although host system 405 and memory system 410 are shown performing the operations of process flow 400, some aspects of some operations may also be performed by one or more other devices or systems.

Aspects of the process flow 400 may be implemented by a controller (e.g., the controller 330, a controller 115 or 135, a controller 215 or 230), among other components. Additionally or alternatively, aspects of the process flow 400 may be implemented as instructions stored in memory (e.g., firmware stored in a memory coupled with or part of a memory system). For example, the instructions, when executed by a controller (e.g., the controller 330, a controller 115 or 135, a controller 215 or 230), may cause the controller to perform the operations of the process flow 400.

At 415, an indication of a threshold quantity of data associated with a set of physical addresses of a memory array that have a higher reliability may be transmitted. In some cases, the memory system 410 may transmit, to the host system 405, an indication of a threshold quantity of data associated with a set of physical addresses of a memory array that have a higher reliability. The set of physical addresses may, for example, be reserved for boot information, and in some examples may represent all or a portion of a block (e.g., a static, reserved block) of SLCs of the memory array. In some cases, the memory system 410 may transmit the indication of the threshold quantity to the host system 405 as part of a factory initialization, in response to performing a boot procedure, or at any other time.

In some cases, the threshold quantity of data may represent a threshold of defragmented boot information that may be stored in the set of physical addresses (e.g., in higher reliability memory). For example, the threshold quantity of data may represent an amount of memory contents that the memory system 410 may support defragmenting as boot information. In some cases when the threshold quantity of data represents a quantity of defragmented boot information, the threshold quantity of data may be indicated by the memory system 410 via a register, which may indicate the threshold quantity of data to the host system 405. In such cases, the threshold quantity of data may represent a maximum amount of boot information that may be stored in the set of physical addresses, such that any information above the threshold may not be considered boot information (e.g., or may not be considered boot information stored in higher reliability memory).

At 420, an indication of a set of multiple logical addresses (e.g., a set of LBAs) associated with storing information for initializing the host system 405 (e.g., associated with boot information) may be transmitted. For example, the host system 405 may transmit, to the memory system 410, the indication of a set of multiple logical addresses (e.g., a set of LBAs) associated with the boot information.

In a first example (e.g., as described with reference to FIG. 3), the host system 405 may indicate the set of logical addresses via a command specific to the host system 405 (e.g., a custom command), where the command may identify the set of logical addresses as associated with the boot information. The set of logical addresses identified by the command may be associated with a quantity of data less than or equal to the threshold quantity of data, for example, based on or in response to the host system 405 receiving the indication of the threshold quantity of data from the memory system 410 (e.g., at 415).

The command may be transmitted at any time, such as during a factory initialization (e.g., in examples in which the boot information is first written to the memory array of the memory system 410), before performing a boot procedure, after performing a boot procedure, before writing or updating the boot information at the memory system 410 (e.g., to the memory array of the memory system 410), or after writing or updating the boot information to the memory system 410. For example, the command may be transmitted after the boot information is first stored at the memory array of the memory system 410 (e.g., at a factory) and any time the boot information is updated.

The command may be created for the host system 405 (e.g., by a manufacturer, owner, or operator of the host system 405) and may meet, or satisfy, one or more parameters established for a command that indicates boot information. For example, the command may indicate (e.g., via an identifier, OPCODE, or flag associated with the command) that the command is associated with identifying boot information (e.g., that the command indicates boot relevant data or information). In some cases, the command may include an indication of a quantity of regions of the memory array (e.g., storage regions of the memory array), such as regions associated with reliable performance of a boot procedure (e.g., critical regions for a reliable boot procedure). In such cases, the command may further indicate one or more respective logical addresses within each region that are associated with the boot information. For example, the command may indicate a respective starting logical address (e.g., start LBA) of the boot information for each region, as well as a respective quantity of logical addresses (e.g., quantity of LBAs) associated with the boot information for each region.

In a second example (e.g., as described with reference to FIG. 3), the host system 405 may indicate the set of logical addresses via one or more boot commands (e.g., read commands) that indicate for the memory system 410 to read data associated with initialization of the host system 405 (e.g., to read the boot information). The host system 405 may, for example, issue the one or more boot commands as part of an initialization or boot procedure for the host system 405, in which the boot information may be accessed from the memory system 410 (e.g., from the memory array) and used for initializing the host system 405.

At 425, the boot information (e.g., information for initializing the host system 405) may be identified at a set of multiple first physical addresses (e.g., of the memory array), based on or in response to receiving the indication of the set of logical addresses. For example, the memory system 410 may identify the boot information at the set of multiple first physical addresses. Each first physical address of the set of first physical addresses may be associated with a corresponding logical address of the set of logical addresses, where the set of first physical addresses may represent at least some physical addresses having a lower reliability (e.g., having multiple levels of cells), as described with reference to FIG. 3.

In the first example, the memory system 410 may identify the boot information at the set of first physical addresses based on the set of logical addresses indicated in the command transmitted by the host system 405. For example, because the command may indicate that the set of logical addresses is associated with the boot information, the memory system 410 may identify logical addresses, and the corresponding first physical addresses, based on or in response to the command.

In the second example, the memory system 410 may identify the boot information at the set of first physical addresses based on or in response to entering an operating state to track the boot information, based on or in response to receiving the one or more boot commands (e.g., one or more read commands). For example, upon reception of the boot command(s) (e.g., a boot access) and detection that the host system 405 is initializing, the memory system 410 may enter a boot detection state to track the boot information identified by the boot command(s). In the operating state, the memory system 410 may track logical addresses (e.g., LBAs) indicated by the boot command(s) up to the threshold quantity of data associated with the reliable memory for storing the boot information (e.g., up to 512 MB, 784 MB). For example, the memory system 410 may track or identify unique logical addresses accessed during a boot procedure associated with the boot command(s). Based on or in response to identifying the logical addresses associated with the boot procedure (e.g., up to the threshold quantity of data), the memory system 410 may identify the corresponding first physical addresses.

In some cases, the one or more boot commands may indicate logical addresses beyond the threshold quantity of data (e.g., second or additional logical addresses). In such cases, the memory system 410 may track first or initial logical addresses indicated by the host system 405 (e.g., up to the threshold), and may refrain from tracking other, additional logical addresses (e.g., because the first or initial logical addresses may have more relevance for performing a reliable boot procedure). For example, the memory system 410 may track the logical addresses up to the threshold quantity of data and may stop, or exit the operating mode, based on or in response to identifying that a quantity of data associated with the tracked logical addresses is equal to the threshold quantity of data. Additionally or alternatively, the memory system 410 may track the logical addresses up to the threshold quantity of data and may stop, or exit the operating mode, based on or in response to identifying that a quantity of data associated with the tracked logical addresses is less than the threshold quantity of data, but may exceed the threshold quantity of data if another logical address or set of logical addresses is tracked.

In some cases, the one or more boot commands may indicate logical addresses that do not exceed the threshold quantity of data. In such cases, the memory system 410 may track the logical addresses up to the threshold quantity of data and may stop, or exit the operating mode, based on or in response to identifying that the one or more boot commands have been completed or based on or in response to identifying that a quantity of data associated with the tracked logical addresses is less than the threshold quantity of data.

The memory system 410 may enter the operating state for detecting the boot information periodically, for example, in order to refrain from tracking boot information each time a boot procedure is performed (e.g., which may increase power consumption). For example, the memory system 410 may refrain from entering the operating state for detecting the boot information until one or more conditions are met. The condition(s) may include satisfying (e.g., meeting or exceeding) a threshold quantity of received boot commands or boot procedures, satisfying a threshold quantity of time from initially storing the boot information (e.g., at the first physical addresses), satisfying a threshold quantity of time from entering the operating state, or any combination thereof. In some cases, the memory system 410 may enter the operating state for a first boot procedure (e.g., in a factory or other deployment) and may enter the operating state periodically based on or in response to the one or more conditions described herein.

In some cases, at 430, the boot information may be read or transmitted to the host system 405. In some cases, the memory system 410 may transmit, or read, the boot information to the host system 405. For example, if the memory system 410 identifies the boot information as part of a boot procedure with the host system 405, the memory system 410 may transmit the indicated boot information (e.g., along with other boot information) to the host system 405 as part of the boot procedure.

At 435, the boot information (e.g., information for initializing the host system 405) may be transferred from the set of first physical addresses to a set of multiple second physical addresses having a higher reliability than the set of first physical addresses. For example, based on or in response to identifying the boot information, the memory system 410 may transfer the boot information from the set of first physical addresses to the set of second physical addresses. The set of second physical addresses may, for example, represent the set of physical addresses associated with the threshold quantity of data (e.g., indicated at 415). The set of second physical addresses may, in some cases, be or represent multiple SLCs of the memory system 410, such as a block (e.g., or portion thereof) of reserved SLCs.

In some cases, the memory system 410 may transfer the boot information as part of performing a data management operation at the memory system 410, during an idle duration of the memory system. For example, the memory system 410 may transfer the boot information during performing housekeeping work, such as defragmentation or a data refresh. Moving the boot information may not change the logical addresses associated with the boot information, and as such, the logical addresses used by the host system 405 and the memory system 410 for the boot information may remain unchanged after transferring the boot information.

Figure 5:
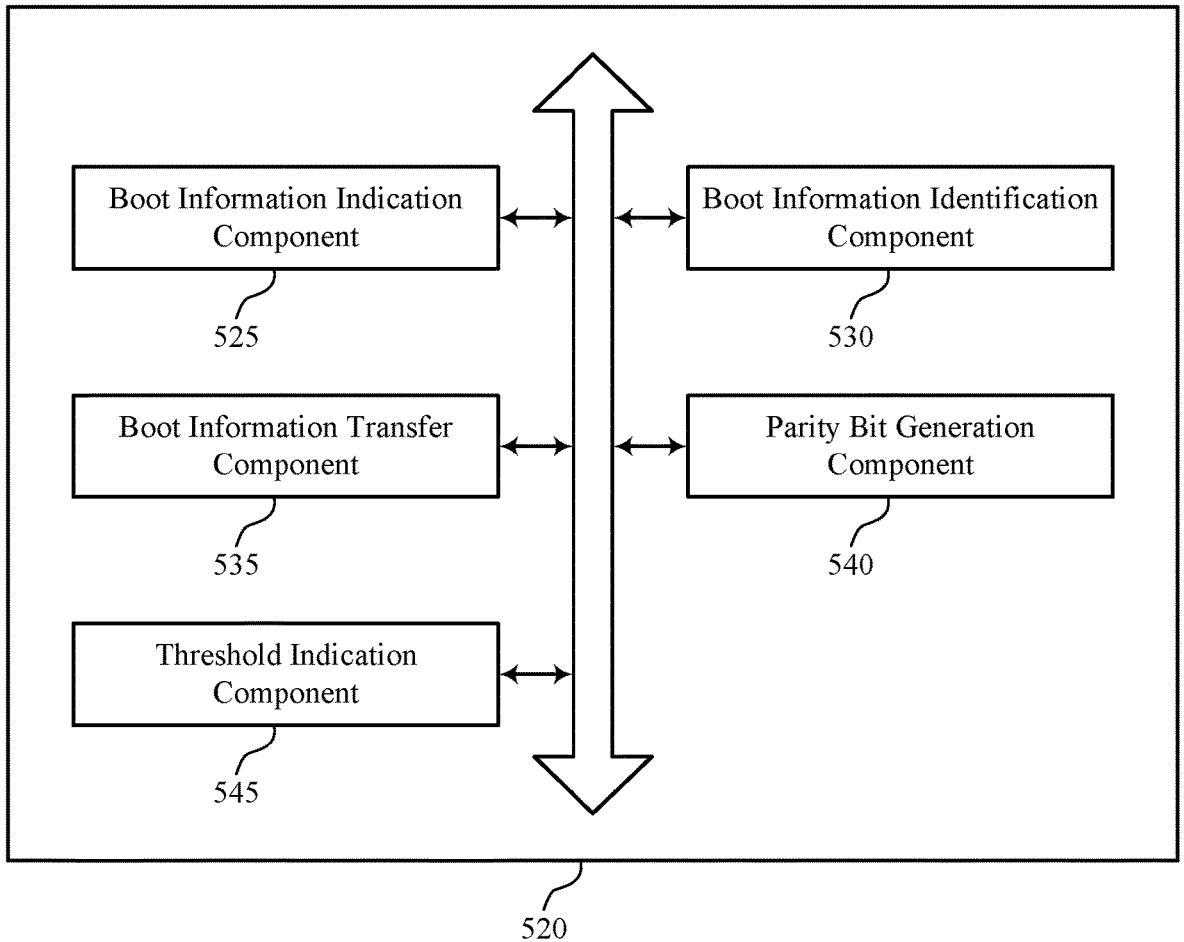
FIG. 5 shows a block diagram of a memory system that supports identification and storage of boot information at a memory system in accordance with examples as disclosed herein.

FIG. 5 shows a block diagram 500 of a memory system 520 that supports identification and storage of boot information at a memory system in accordance with examples as disclosed herein. The memory system 520 may be an example of aspects of a memory system as described with reference to FIGS. 1 through 4. The memory system 520, or various components thereof, may be an example of means for performing various aspects of identification and storage of boot information at a memory system as described herein. For example, the memory system 520 may include a boot information indication component 525, a boot information identification component 530, a boot information transfer component 535, a parity bit generation component 540, a threshold indication component 545, or any combination thereof. Each of these components may communicate, directly or indirectly, with one another (e.g., via one or more buses).

The boot information indication component 525 may be configured as or otherwise support a means for receiving, at a memory system, an indication of a plurality of logical addresses associated with storing information for initializing a host system. The boot information identification component 530 may be configured as or otherwise support a means for identifying the information for initializing the host system stored at a plurality of first physical addresses based at least in part on receiving the indication of the plurality of logical addresses, each of the plurality of logical addresses associated with a corresponding first physical address of the plurality of first physical addresses. The boot information transfer component 535 may be configured as or otherwise support a means for transferring the information for initializing the host system from the plurality of first physical addresses to a plurality of second physical addresses having a higher reliability than the plurality of first physical addresses based at least in part on identifying the information for initializing the host system at the plurality of first physical addresses.

In some examples, the boot information transfer component 535 may be configured as or otherwise support a means for performing a data management operation at the memory system during an idle duration of the memory system, where transferring the information for initializing the host system occurs during the data management operation and is based at least in part on performing the data management operation.

In some examples, to support receiving the indication of the plurality of logical addresses, the boot information indication component 525 may be configured as or otherwise support a means for receiving, at the memory system, a boot command that indicates for the memory system to read data associated with initialization of the host system.

In some examples, the boot information identification component 530 may be configured as or otherwise support a means for entering an operating state to track the information for initializing the host system based at least in part on receiving the boot command. In some examples, the boot information identification component 530 may be configured as or otherwise support a means for identifying, in one or more commands that include the boot command, the plurality of logical addresses associated with the information for initializing the host system based at least in part on entering the operating state, where identifying the information for initializing the host system at the plurality of first physical addresses is based at least in part on identifying the plurality of logical addresses.

In some examples, the plurality of logical addresses is associated with a threshold quantity of data, and the boot information identification component 530 may be configured as or otherwise support a means for exiting the operating state based at least in part on identifying that the quantity of data associated with the plurality of logical addresses is equal to the threshold quantity of data.

In some examples, the plurality of logical addresses is associated with a threshold quantity of data, and the boot information identification component 530 may be configured as or otherwise support a means for exiting the operating state based at least in part on identifying that the quantity of data associated with the plurality of logical addresses is less than the threshold quantity of data.

In some examples, the one or more commands include an indication of a plurality of second logical addresses associated with storing second information for initializing the host system. In some examples, entering the operating state is based at least in part on receiving a threshold quantity of boot commands, satisfying a threshold quantity of time from storing the information for initializing the host system at the plurality of first physical addresses, or both.

In some examples, to support receiving the indication of the plurality of logical addresses, the boot information indication component 525 may be configured as or otherwise support a means for receiving, at the memory system, a command specific to the host system that identifies the plurality of logical addresses as associated with the information for initializing the host system.

In some examples, the threshold indication component 545 may be configured as or otherwise support a means for transmitting, from the memory system, an indication of a threshold quantity of data associated with the plurality of second physical addresses, where the plurality of logical addresses is associated with a quantity of data that is less than or equal to the threshold quantity of data, and where receiving the command is based at least in part on transmitting the indication of the threshold quantity of data. In some examples, the threshold indication component 545 may be configured as or otherwise support a means for indicating the threshold quantity of data via a register associated with the memory system, where the threshold quantity of data is associated with defragmented data.

In some examples, the command indicates one or more storage regions associated with the information for initializing the host system and indicates one or more respective logical addresses of the plurality of logical addresses for each of the one or more storage regions.

In some examples, at least a portion of the plurality of first physical addresses corresponds to a plurality of cells each having at least two levels. In some examples, the plurality of second physical addresses corresponds to a plurality of SLCs.

In some examples, the parity bit generation component 540 may be configured as or otherwise support a means for generating a set of parity bits associated with the information for initializing the host system based at least in part on transferring the information for initializing the host system. In some examples, the parity bit generation component 540 may be configured as or otherwise support a means for generating an additional set of parity bits associated with the information for initializing the host system based at least in part on transferring the information for initializing the host system.

Figure 6:
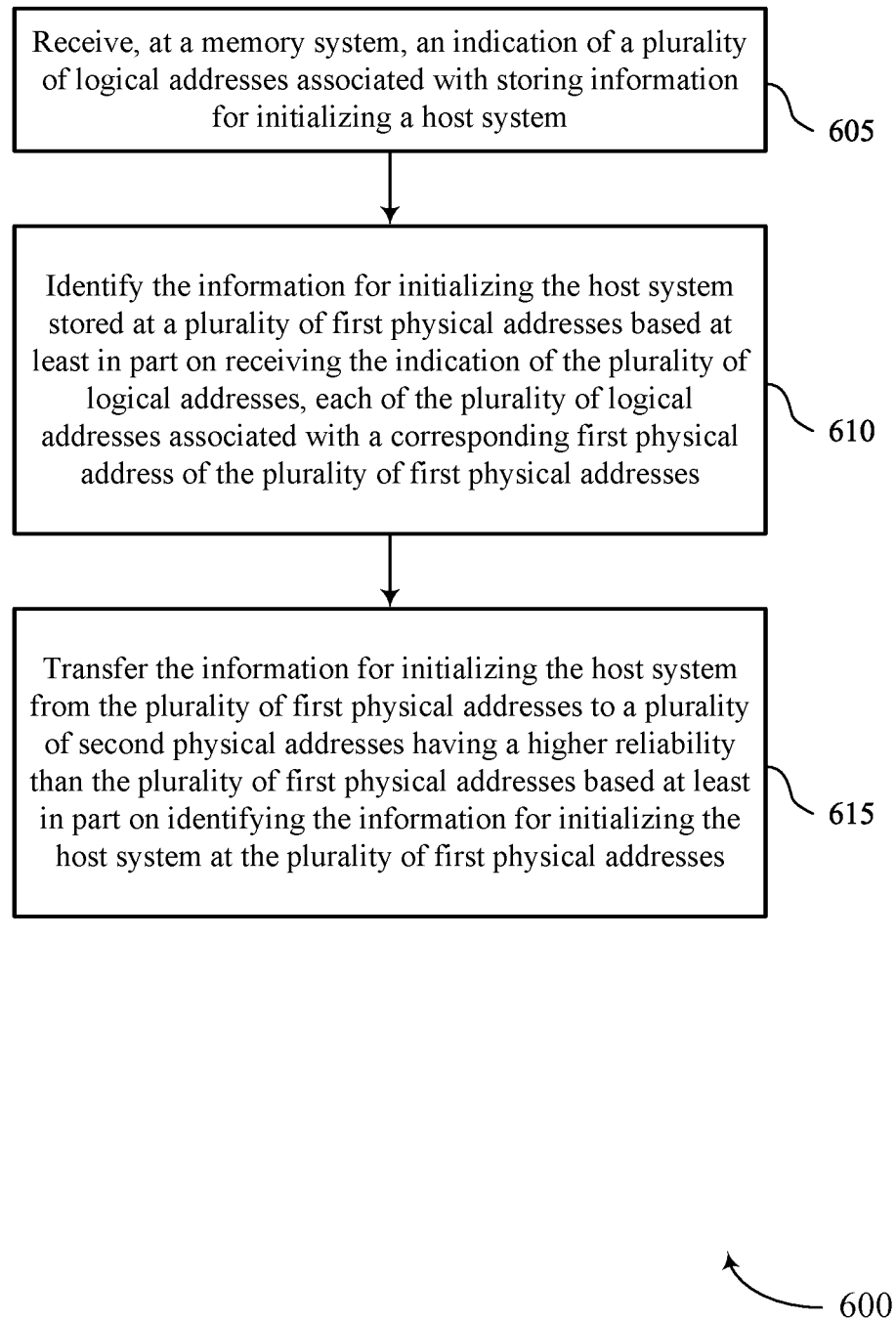
FIG. 6 shows a flowchart illustrating a method or methods that support identification and storage of boot information at a memory system in accordance with examples as disclosed herein.

FIG. 6 shows a flowchart illustrating a method 600 that supports identification and storage of boot information at a memory system in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally or alternatively, the memory system may perform aspects of the described functions using special-purpose hardware.

At 605, the method may include receiving, at a memory system, an indication of a plurality of logical addresses associated with storing information for initializing a host system. The operations of 605 may be performed in accordance with examples as disclosed herein. In some examples, aspects of the operations of 605 may be performed by a boot information indication component 525 as described with reference to FIG. 5.

At 610, the method may include identifying the information for initializing the host system stored at a plurality of first physical addresses based at least in part on receiving the indication of the plurality of logical addresses, each of the plurality of logical addresses associated with a corresponding first physical address of the plurality of first physical addresses. The operations of 610 may be performed in accordance with examples as disclosed herein. In some examples, aspects of the operations of 610 may be performed by a boot information identification component 530 as described with reference to FIG. 5.

At 615, the method may include transferring the information for initializing the host system from the plurality of first physical addresses to a plurality of second physical addresses having a higher reliability than the plurality of first physical addresses based at least in part on identifying the information for initializing the host system at the plurality of first physical addresses. The operations of 615 may be performed in accordance with examples as disclosed herein. In some examples, aspects of the operations of 615 may be performed by a boot information transfer component 535 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory system, an indication of a plurality of logical addresses associated with storing information for initializing a host system; identifying the information for initializing the host system stored at a plurality of first physical addresses based at least in part on receiving the indication of the plurality of logical addresses, each of the plurality of logical addresses associated with a corresponding first physical address of the plurality of first physical addresses; and transferring the information for initializing the host system from the plurality of first physical addresses to a plurality of second physical addresses having a higher reliability than the plurality of first physical addresses based at least in part on identifying the information for initializing the host system at the plurality of first physical addresses.

Aspect 2: The method, apparatus, or non-transitory computer-readable medium of aspect 1, further including operations, features, circuitry, logic, means, or instructions, or any combination thereof for performing a data management operation at the memory system during an idle duration of the memory system, where transferring the information for initializing the host system occurs during the data management operation and is based at least in part on performing the data management operation.

Aspect 3: The method, apparatus, or non-transitory computer-readable medium of any of aspects 1 through 2 where receiving the indication of the plurality of logical addresses includes operations, features, circuitry, logic, means, or instructions, or any combination thereof for receiving, at the memory system, a boot command that indicates for the memory system to read data associated with initialization of the host system.

Aspect 4: The method, apparatus, or non-transitory computer-readable medium of aspect 3, further including operations, features, circuitry, logic, means, or instructions, or any combination thereof for entering an operating state to track the information for initializing the host system based at least in part on receiving the boot command and identifying, in one or more commands that include the boot command, the plurality of logical addresses associated with the information for initializing the host system based at least in part on entering the operating state, where identifying the information for initializing the host system at the plurality of first physical addresses is based at least in part on identifying the plurality of logical addresses.

Aspect 5: The method, apparatus, or non-transitory computer-readable medium of aspect 4 where the plurality of logical addresses is associated with a threshold quantity of data and the method, apparatuses, and non-transitory computer-readable medium, further includes operations, features, circuitry, logic, means, or instructions, or any combination thereof for exiting the operating state based at least in part on identifying that the quantity of data associated with the plurality of logical addresses is equal to the threshold quantity of data.

Aspect 6: The method, apparatus, or non-transitory computer-readable medium of any of aspects 4 through 5 where the plurality of logical addresses is associated with a threshold quantity of data and the method, apparatuses, and non-transitory computer-readable medium, further includes operations, features, circuitry, logic, means, or instructions, or any combination thereof for exiting the operating state based at least in part on identifying that the quantity of data associated with the plurality of logical addresses is less than the threshold quantity of data.

Aspect 7: The method, apparatus, or non-transitory computer-readable medium of any of aspects 4 through 6 where the one or more commands include an indication of a plurality of second logical addresses associated with storing second information for initializing the host system.

Aspect 8: The method, apparatus, or non-transitory computer-readable medium of any of aspects 4 through 7 where entering the operating state is based at least in part on receiving a threshold quantity of boot commands, satisfying a threshold quantity of time from storing the information for initializing the host system at the plurality of first physical addresses, or both.

Aspect 9: The method, apparatus, or non-transitory computer-readable medium of any of aspects 1 through 8 where receiving the indication of the plurality of logical addresses includes operations, features, circuitry, logic, means, or instructions, or any combination thereof for receiving, at the memory system, a command specific to the host system that identifies the plurality of logical addresses as associated with the information for initializing the host system.

Aspect 10: The method, apparatus, or non-transitory computer-readable medium of aspect 9, further including operations, features, circuitry, logic, means, or instructions, or any combination thereof for transmitting, from the memory system, an indication of a threshold quantity of data associated with the plurality of second physical addresses, where the plurality of logical addresses is associated with a quantity of data that is less than or equal to the threshold quantity of data, and where receiving the command is based at least in part on transmitting the indication of the threshold quantity of data.

Aspect 11: The method, apparatus, or non-transitory computer-readable medium of aspect 10, further including operations, features, circuitry, logic, means, or instructions, or any combination thereof for indicating the threshold quantity of data via a register associated with the memory system, wherein the threshold quantity of data is associated with defragmented data.

Aspect 12: The method, apparatus, or non-transitory computer-readable medium of any of aspects 9 through 11 where the command indicates one or more storage regions associated with the information for initializing the host system and indicates one or more respective logical addresses of the plurality of logical addresses for each of the one or more storage regions.

Aspect 13: The method, apparatus, or non-transitory computer-readable medium of any of aspects 1 through 12 where at least a portion of the plurality of first physical addresses corresponds to a plurality of cells each having at least two levels.

Aspect 14: The method, apparatus, or non-transitory computer-readable medium of any of aspects 1 through 13 where the plurality of second physical addresses corresponds to a plurality of single-level cells.

Aspect 15: The method, apparatus, or non-transitory computer-readable medium of any of aspects 1 through 14, further including operations, features, circuitry, logic, means, or instructions, or any combination thereof for generating a set of parity bits associated with the information for initializing the host system based at least in part on transferring the information for initializing the host system and generating an additional set of parity bits associated with the information for initializing the host system based at least in part on transferring the information for initializing the host system.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
    one or more memory devices; and
    processing circuitry coupled with the one or more memory devices and configured to cause the memory system to:
        store, at a first memory portion of a memory device of the one or more memory devices, information for initializing a host system, the information comprising a first set of data stored at a plurality of first physical addresses corresponding to a plurality of first logical addresses and a second set of data stored at a plurality of second physical addresses corresponding to a plurality of second logical addresses, wherein the first memory portion has a lower reliability than a second memory portion corresponding to plurality of third physical addresses;

identify a threshold quantity of data that can be transferred from the first memory portion to the second memory portion, the threshold quantity of data associated with the plurality of third physical addresses;

receive, at the memory system and based at least in part on identifying the threshold quantity of data, an indication of the plurality of first logical addresses;

identify the first set of data stored at the plurality of first physical addresses based at least in part on receiving the indication of the plurality of first logical addresses, each of the plurality of first logical addresses associated with a corresponding first physical address of the plurality of first physical addresses; and transfer the first set of data from the plurality of first physical addresses to the plurality of third physical addresses having a higher reliability than the plurality of first physical addresses based at least in part on identifying the first set of data at the plurality of first physical addresses and a summation of the first set of data and the second set of data exceeding the threshold quantity of data, wherein the second set of data remains stored at the plurality of second physical addresses.

2. The memory system of claim 1, wherein the processing circuitry is further configured to cause the memory system to:

perform a data management operation at the memory system during an idle duration of the memory system, wherein transferring the first set of data during the data management operation and is based at least in part on performing the data management operation.

3. The memory system of claim 1, wherein the processing circuitry is further configured to receive the plurality of first logical addresses by causing the memory system to:

receive, at the memory system, a boot command that indicates for the memory system to read data associated with initialization of the host system.

4. The memory system of claim 3, wherein the processing circuitry is further configured to cause the memory system to:

enter an operating state to track the information for initializing the host system based at least in part on receiving the boot command; and identify, in one or more commands that comprise the boot command, the plurality of first logical addresses associated with the first set of data based at least in part on entering the operating state, wherein identifying the first set of data at the plurality of first physical addresses is based at least in part on identifying the plurality of first logical addresses.

5. The memory system of claim 4, wherein the plurality of first logical addresses is associated with the threshold quantity of data, and the processing circuitry is further configured to cause the memory system to:

exit the operating state based at least in part on identifying that a quantity of data associated with the plurality of first logical addresses is equal to the threshold quantity of data.

6. The memory system of claim 4, wherein the plurality of first logical addresses is associated with the threshold quantity of data, and the processing circuitry is further configured to cause the memory system to:

exit the operating state based at least in part on identifying that a quantity of data associated with the plurality of first logical addresses is less than the threshold quantity of data.

7. The memory system of claim 4, wherein the one or more commands comprise an indication of a plurality of third logical addresses associated with storing second information for initializing the host system.

8. The memory system of claim 4, wherein entering the operating state is based at least in part on receiving a threshold quantity of boot commands, satisfying a threshold quantity of time from storing the first set of data at the plurality of first physical addresses, or both.

9. The memory system of claim 1, wherein the processing circuitry is further configured to receive the plurality of first logical addresses by causing the memory system to:

receive, at the memory system, a command specific to the host system that identifies the plurality of first logical addresses as associated with the information for initializing the host system.

10. The memory system of claim 9, wherein the processing circuitry is further configured to cause the memory system to:

transmit, from the memory system, an indication of the threshold quantity of data, wherein the plurality of first logical addresses is associated with a quantity of data that is less than or equal to the threshold quantity of data.

11. The memory system of claim 10, wherein, to transmit the indication of the threshold quantity of data, the processing circuitry is further configured to cause the memory system to:

indicate the threshold quantity of data via a register associated with the memory system, wherein the threshold quantity of data is associated with defragmented data.

12. The memory system of claim 9, wherein the command indicates one or more storage regions associated with the information for initializing the host system and indicates one or more respective logical addresses of the plurality of first logical addresses for each of the one or more storage regions.

13. The memory system of claim 1, wherein at least a portion of the plurality of first physical addresses corresponds to a plurality of cells each having at least two levels.

14. The memory system of claim 1, wherein the plurality of third physical addresses corresponds to a plurality of single-level cells.

15. The memory system of claim 1, wherein the processing circuitry is further configured to cause the memory system to:

generate a set of parity bits associated with the first set of data based at least in part on transferring the first set of data; and generate an additional set of parity bits associated with the first set of data based at least in part on transferring the first set of data.

16. A non-transitory computer-readable medium storing code comprising instructions which, when executed by processing circuitry of an electronic device, cause the electronic device to:
- store, at a first memory portion of a memory device, information for initializing a host system, the information comprising a first set of data stored at a plurality of first physical addresses corresponding to a plurality of first logical addresses and a second set of data stored at a plurality of second physical addresses corresponding to a plurality of second logical addresses, wherein the first memory portion has a lower reliability than a second memory portion corresponding to plurality of third physical addresses;
- identify a threshold quantity of data that can be transferred from the first memory portion to the second memory portion, the threshold quantity of data associated with the plurality of third physical addresses;
- receive, at a memory system and based at least in part on identifying the threshold quantity of data, an indication of the plurality of first logical addresses;
- identify the first set of data stored at the plurality of first physical addresses based at least in part on receiving the indication of the plurality of first logical addresses, each of the plurality of first logical addresses associated with a corresponding first physical address of the plurality of first physical addresses; and
- transfer the first set of data from the plurality of first physical addresses to the plurality of third physical addresses having a higher reliability than the plurality of first physical addresses based at least in part on identifying the first set of data at the plurality of first physical addresses and a summation of the first set of data and the second set of data exceeding the threshold quantity of data, wherein the second set of data remains stored at the plurality of second physical addresses.

17. The non-transitory computer-readable medium of claim 16, wherein the instructions, when executed by the processing circuitry of the electronic device, further cause the electronic device to:
- perform a data management operation at the memory system during an idle duration of the memory system, wherein transferring the first set of data occurs during the data management operation and is based at least in part on performing the data management operation.

18. The non-transitory computer-readable medium of claim 16, wherein the instructions to receive the indication of the plurality of first logical addresses, when executed by the processing circuitry of the electronic device, further cause the electronic device to:
- receive, at the memory system, a boot command that indicates for the memory system to read data associated with initialization of the host system.

19. The non-transitory computer-readable medium of claim 18, wherein the instructions, when executed by the processing circuitry of the electronic device, further cause the electronic device to:
- enter an operating state to track the information for initializing the host system based at least in part on receiving the boot command; and
- identify, in one or more commands that comprise the boot command, the plurality of first logical addresses associated with the first set of data based at least in part on entering the operating state, wherein identifying the first set of data at the plurality of first physical addresses is based at least in part on identifying the plurality of first logical addresses.

20. The non-transitory computer-readable medium of claim 19, wherein the plurality of first logical addresses is associated with the threshold quantity of data, and wherein the instructions, when executed by the processing circuitry of the electronic device, further cause the electronic device to:
- exit the operating state based at least in part on identifying that a quantity of data associated with the plurality of first logical addresses is equal to the threshold quantity of data.

21. The non-transitory computer-readable medium of claim 19, wherein the plurality of first logical addresses is associated with the threshold quantity of data, and wherein the instructions, when executed by the processing circuitry of the electronic device, further cause the electronic device to:
- exit the operating state based at least in part on identifying that a quantity of data associated with the plurality of first logical addresses is less than the threshold quantity of data.

22. The non-transitory computer-readable medium of claim 19, wherein entering the operating state is based at least in part on receiving a threshold quantity of boot commands, satisfying a threshold quantity of time from storing the first set of data at the plurality of first physical addresses, or both.

23. The non-transitory computer-readable medium of claim 16, wherein the instructions to receive the indication of the plurality of first logical addresses, when executed by the processing circuitry of the electronic device, further cause the electronic device to:
- receive, at the memory system, a command specific to the host system that identifies the plurality of first logical addresses as associated with the information for initializing the host system.

24. The non-transitory computer-readable medium of claim 23, wherein the instructions, when executed by the processing circuitry of the electronic device, further cause the electronic device to:
- transmit, from the memory system, an indication of the threshold quantity of data, wherein the plurality of first logical addresses is associated with a quantity of data that is less than or equal to the threshold quantity of data.

25. A method, comprising:
- transmitting, from a memory system, an indication of a threshold quantity of boot information that can be transferred from first memory to second memory, the second memory having a higher reliability than the first memory, wherein the boot information comprises information for initializing a host system;
- receiving, at the memory system, an indication of a plurality of logical addresses associated with storing the information for initializing the host system based at least in part on transmitting the indication of the threshold quantity of boot information, wherein the plurality of logical addresses is associated with a quantity of data that is less than or equal to the threshold quantity of boot information;
- identifying the information for initializing the host system stored at a plurality of first physical addresses based at least in part on receiving the indication of the plurality of logical addresses, each of the plurality of logical addresses associated with a corresponding first physical address of the plurality of first physical addresses; and
- transferring the information for initializing the host system from the plurality of first physical addresses to a plurality of second physical addresses having a higher reliability than the plurality of first physical addresses based at least in part on identifying the information for initializing the host system at the plurality of first physical addresses.

* * * * *